(12) United States Patent
Keeth et al.

(10) Patent No.: US 7,155,561 B2
(45) Date of Patent: Dec. 26, 2006

(54) METHOD AND SYSTEM FOR USING DYNAMIC RANDOM ACCESS MEMORY AS CACHE MEMORY

(75) Inventors: Brent Keeth, Boise, ID (US); Brian M. Shirley, Boise, ID (US); Charles H. Dennison, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/230,836

(22) Filed: Sep. 19, 2005

(65) Prior Publication Data

US 2006/0015679 A1 Jan. 19, 2006

Related U.S. Application Data

(63) Continuation of application No. 10/815,877, filed on Mar. 30, 2004, now Pat. No. 6,948,027, which is a continuation of application No. 09/642,546, filed on Aug. 17, 2000, now Pat. No. 6,862,654.

(51) Int. Cl.
*G06F 12/16* (2006.01)
(52) U.S. Cl. .................. 711/106; 365/222; 365/203; 365/228
(58) Field of Classification Search .............. None
See application file for complete search history.

(56) References Cited

U.S. PATENT DOCUMENTS

| | | | | |
|---|---|---|---|---|
| 4,829,484 A | 5/1989 | Arimoto et al. | ............ | 365/222 |
| 5,287,481 A | 2/1994 | Lin | ............ | 395/425 |
| 5,359,722 A | 10/1994 | Chan et al. | ............ | 395/425 |
| 5,421,000 A | 5/1995 | Fortino et al. | ............ | 395/425 |
| 5,471,601 A | 11/1995 | Gonzales | ............ | 395/403 |
| 5,473,770 A | 12/1995 | Vrba | ............ | 395/433 |
| 5,509,132 A | 4/1996 | Matsuda et al. | ............ | 395/403 |
| 5,577,223 A | 11/1996 | Tanoi et al. | ............ | 395/445 |
| 5,677,878 A | 10/1997 | Shirley et al. | ............ | 365/189.11 |
| 5,699,317 A | 12/1997 | Sartore et al. | ............ | 365/230.06 |
| 5,721,862 A | 2/1998 | Sartore et al. | ............ | 395/445 |
| 5,777,942 A | 7/1998 | Dosaka et al. | ............ | 365/230.03 |
| 5,787,457 A | 7/1998 | Miller et al. | ............ | 711/105 |
| 5,829,026 A | 10/1998 | Leung et al. | ............ | 711/122 |
| 5,829,036 A | 10/1998 | Klein | ............ | 711/141 |
| 5,831,924 A | 11/1998 | Nitta et al. | ............ | 365/230.03 |

(Continued)

OTHER PUBLICATIONS

Glaskowsky, Peter N., "MoSys Explains 1T-SRAM Technology," MicroDesign Resources, MicroProcessor Report, Sep. 13, 1999, p. 23.

*Primary Examiner*—B. James Peikari
(74) *Attorney, Agent, or Firm*—Dorsey & Whitney LLP

(57) ABSTRACT

A cache memory system and method includes a DRAM having a plurality of banks, and it also includes 2 SRAMs each having a capacity that is equal to the capacity of each bank of the DRAM. In operation, data read from a bank of the DRAM are stored in one of the SRAMs so that repeated hits to that bank are cached by reading from the SRAM. In the event of a write to a bank that is being refreshed, the write data are stored in one of the SRAMs. After the refresh of the bank has been completed, the data stored in the SRAM are transferred to the DRAM bank. A subsequent read or write to a second DRAM bank undergoing refresh and occurring during the transfer of data from an SRAM to the DRAM is stored in either the second bank or the other SRAM.

50 Claims, 2 Drawing Sheets

U.S. PATENT DOCUMENTS

| | | | | |
|---|---|---|---|---|
| 5,835,401 | A | 11/1998 | Green et al. | 365/149 |
| 5,875,451 | A | 2/1999 | Joseph | 711/105 |
| 5,875,452 | A | 2/1999 | Katayama et al. | 711/105 |
| 5,943,681 | A | 8/1999 | Ooishi | 711/105 |
| 5,991,851 | A | 11/1999 | Alwais et al. | 711/106 |
| 5,999,474 | A | 12/1999 | Leung et al. | 365/222 |
| 6,002,625 | A | 12/1999 | Ahn | 365/206 |
| 6,023,428 | A | 2/2000 | Tran | 365/189.01 |
| 6,061,759 | A | 5/2000 | Guo | 711/105 |
| 6,088,760 | A | 7/2000 | Walker et al. | 711/104 |
| 6,128,700 | A | 10/2000 | Hsu et al. | 711/122 |
| 6,131,140 | A | 10/2000 | Rodgers et al. | 711/104 |
| 6,151,269 | A | 11/2000 | Dosaka et al. | 365/233 |
| 6,151,664 | A | 11/2000 | Borkenhagen et al. | 711/150 |
| 6,170,036 | B1 | 1/2001 | Konishi et al. | 711/104 |
| 6,172,893 | B1 | 1/2001 | Ryan | 365/49 |
| 6,172,927 | B1 | 1/2001 | Taylor | 365/219 |
| 6,173,356 | B1 | 1/2001 | Rao | 711/5 |
| 6,178,133 | B1 | 1/2001 | Manning | 365/230.03 |
| 6,189,073 | B1 | 2/2001 | Pawlowski | 711/120 |
| 6,215,497 | B1 | 4/2001 | Leung | 345/419 |
| 6,226,755 | B1 | 5/2001 | Reeves | 713/400 |
| 6,256,707 | B1 | 7/2001 | Ooishi | 711/118 |
| 6,289,413 | B1 | 9/2001 | Rogers et al. | 711/105 |
| 6,335,896 | B1 | 1/2002 | Wahlstrom | 365/230.03 |
| 6,339,817 | B1 | 1/2002 | Maesako et al. | 711/165 |
| 6,347,063 | B1 | 2/2002 | Dosaka et al. | 365/233 |
| 6,360,292 | B1 | 3/2002 | Manning | 711/5 |
| 6,415,353 | B1 | 7/2002 | Leung | 711/106 |
| 6,438,016 | B1 | 8/2002 | Keeth et al. | 365/63 |
| 6,445,636 | B1 | 9/2002 | Keeth et al. | 365/222 |
| 6,466,507 | B1 | 10/2002 | Ryan | 365/230.01 |
| 6,477,073 | B1 | 11/2002 | Keeth et al. | 365/51 |
| 6,477,631 | B1 | 11/2002 | Martin et al. | 711/167 |
| 6,563,758 | B1 | 5/2003 | Shau | 365/230.05 |
| 6,564,284 | B1 | 5/2003 | Christenson | 711/106 |
| 6,587,918 | B1 | 7/2003 | Christenson | 711/106 |
| 6,601,141 | B1 | 7/2003 | Ooishi | 711/117 |
| 6,629,188 | B1 | 9/2003 | Minkin et al. | 711/3 |
| 6,697,909 | B1 | 2/2004 | Wang et al. | 711/106 |
| 2002/0006071 | A1 | 1/2002 | Ikeda et al. | 365/230.03 |
| 2002/0069325 | A1 | 6/2002 | Pong et al. | 711/118 |

METHOD AND SYSTEM FOR USING DYNAMIC RANDOM ACCESS MEMORY AS CACHE MEMORY

CROSS-REFERENCE TO RELATED APPLICATION

This application is a continuation of pending U.S. patent application Ser. No. 10/815,877, filed Mar. 30, 2004, now U.S. Pat. No. 6,948,027, which is a continuation of U.S. patent application Ser. No. 09/642,546, filed Aug. 17, 2000, now U.S. Pat. No. 6,862,654.

TECHNICAL FIELD

The present invention is directed memory devices, and, more particularly, to a system and method for allowing dynamic random access memory devices to be used as cache memory.

BACKGROUND OF THE INVENTION

Memory devices are used in a wide variety of applications, including computer systems. Computer systems and other electronic devices containing a microprocessor or similar device typically include system memory, which is generally implemented using dynamic random access memory ("DRAM"). The primary advantage of DRAM is that it uses relatively few components to store each bit of data, and is thus relatively inexpensive to provide relatively high capacity system memory. A disadvantage of DRAM, however, is that their memory cells must be periodically refreshed. While a memory cell is being refreshed, read and write accesses to other rows in the memory array are blocked. The need to refresh memory cells does not present a significant problem in most applications, but it can prevent their use in applications where immediate access to memory cells is required or highly desirable.

Also included in many computer systems and other electronic devices is a cache memory. The cache memory stores instructions and/or data (collectively referred to as "data") that is frequently accessed by the processor or similar device, and may be accessed substantially faster than data can be accessed in system memory. It is important for the processor or similar device to be able to access the cache memory as needed. If the cache memory cannot be accessed for a period, the operation of the processor or similar device must be halted during this period. Cache memory is typically implemented using static random access memory ("SRAM") because such memory need not be refreshed and is thus always accessible for a write or a read memory access. However, a significant disadvantage of SRAM is that each memory cell requires a relatively large number of components, thus making SRAM data storage relatively expensive. It would be desirable to implement cache memory using DRAM because high capacity cache memories could then be provided at relatively little cost. However, a cache memory implemented using DRAMs would be inaccessible at certain times during a refresh of the memory cells in the DRAM. For example, during refresh of a row of memory cells, it would be impossible to read data from or write data to other rows of memory cells. As a result of these problems, DRAMs have not generally been considered acceptable for use as cache memory or for other applications requiring immediate access to memory.

Attempts have been made to use DRAM as cache memory, but these attempts have not been entirely successful in solving the refresh problem so that these prior art devices are not always available for a memory access. These prior art devices have attempted to "hide" memory refreshes by including a small SRAM to store one or more rows of DRAM data during refresh of a row being addressed. However, in practice, there are still some memory access situations in which these prior art devices may not be accessed, thus suspending the operation of a processor or similar device.

There is therefore a need for a DRAM that effectively hides memory refresh under all memory access situations so that the DRAM may provide relatively inexpensive, high capacity cache memory.

SUMMARY OF THE INVENTION

A method of caching data and a cache system that may be used in a computer system includes a DRAM having a plurality of refresh blocks and a pair of SRAMs having a capacity of at least the capacity of the refresh blocks. If a block of the DRAM to which data is attempting to be written is being refreshed, the data is instead written to one of the SRAMs. When the refresh of that block has been completed, the data is transferred from the SRAM to a block of the DRAM to which data was attempted to be written. If a block to which data is attempting to be written is being refreshed and data is being transferred from the one SRAM to a block of the DRAM, the data is instead written to the other SRAM. As a result, there is always one SRAM available into which data may be written if a refresh block to which the write was directed is being refreshed.

DETAILED DESCRIPTION OF THE INVENTION

Figure 1:
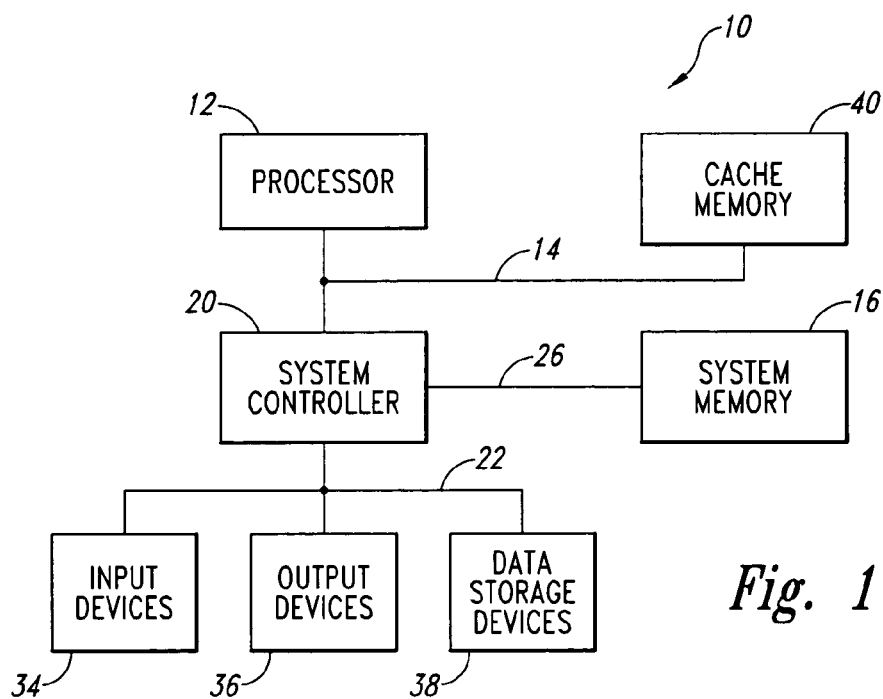
FIG. 1 is a block diagram of a computer system containing a cache memory in accordance with one embodiment of the invention.

FIG. 1 is a block diagram of a computer system 10 that includes a processor 12 for performing various computing functions by executing software to perform specific calculations or tasks. The processor 12 is coupled to a processor bus 14 that normally includes an address bus, a control bus, and a data bus (not separately shown). In addition, the computer system 10 includes a system memory 16, which is typically dynamic random access memory ("DRAM"). As mentioned above, using DRAM at the system memory 16 provides relatively high capacity at relatively little expense. The system memory 16 is coupled to the processor bus 14 by a system controller 20 or similar device, which is also coupled to an expansion bus 22, such as a Peripheral Component Interface ("PCI") bus. A bus 26 coupling the system controller 20 to the system memory 16 also normally includes an address bus, a control bus, and a data bus (not separately shown), although other architectures can be used.

For example, the data bus of the system memory 16 may be coupled to the data bus of the processor bus 14, or the system memory 16 may be implemented by a packetized memory (not shown), which normally does not include a separate address bus and control bus.

The computer system 10 also includes one or more input devices 34, such as a keyboard or a mouse, coupled to the processor 12 through the expansion bus 22, the system controller 20, and the processor bus 14. Also typically coupled to the expansion bus 22 are one or more output devices 36, such as a printer or a video terminal. One or more data storage devices 38 are also typically coupled to the expansion bus 22 to allow the processor 12 to store data or retrieve data from internal or external storage media (not shown). Examples of typical storage devices 38 include hard and floppy disks, tape cassettes, and compact disk read-only memories (CD-ROMs).

The processor 12 is also typically coupled to cache memory 40 through the processor bus 14. In the past, the cache memory 40 was normally implemented using static random access memory ("SRAM") because such memory is relatively fast, and does not require refreshing and may thus always be accessed. However, as explained above, using SRAM for the cache memory 40 is a relatively expensive means for providing a relatively high capacity because of the large number of components making up each SRAM storage cell compared to the number of components in each DRAM storage cell.

Figure 2:
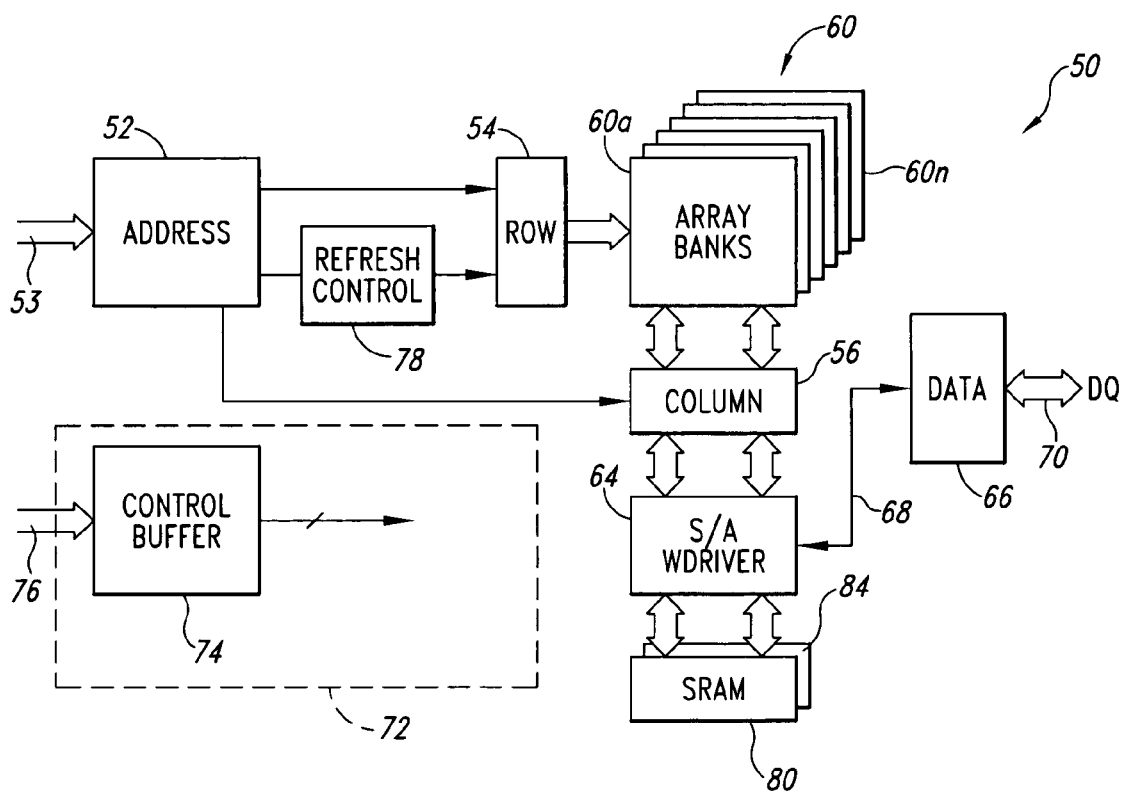
FIG. 2 is a block diagram of a cache system that may be used as a cache memory in the computer system of FIG. 2 in accordance with one embodiment of the invention.

According to one embodiment of the invention, the cache memory 40 shown in FIG. 1 is implemented using a cache system 50, an example of which is shown in FIG. 2. The cache system 50 includes components normally found in a DRAM, including an address decoder 52 receiving addresses through an address bus 53, a row driver circuit 54 adapted to receive row addresses from the address decoder 52, and a column driver circuit 56 adapted to receive column addresses from the address decoder 52. The row driver circuit 54 is coupled to word lines (not shown) in a memory array 60, and the column driver circuit 56 is coupled to digit lines (not shown) in the memory array 60. As shown in FIG. 2, the memory array 60 is either physically or logically divided into a plurality of banks 60a–n. Each bank 60a–n is divided into one or more refresh blocks, each containing a plurality of rows that are contemporaneously refreshed. The column driver 56 is also coupled to a sense amplifier/write driver circuit 64 to route write data and read data from and to, respectively, a data input/output buffer 66 through an internal data bus 68. The data input/output buffer 66 is, in turn, coupled to an external data bus 70. As in conventional DRAMs, the cache system 50 also includes a control circuit 72 that includes a command buffer 74 receiving command signals through a command bus 76 and generating appropriate control signals for controlling the operation of the cache system 50. The control circuit 72 also includes a refresh controller 78 for refreshing the DRAM array 60 one refresh block at a time.

Unlike conventional DRAMs, the cache system 50 also includes two SRAM arrays 80, 84 that are each coupled to the sense amplifier/write driver circuit 64 to access data in the DRAM array 60. The SRAM arrays 80, 84 are also coupled to the refresh controller 78. The refresh controller 78 receives addresses from the address decoder 52, and it applies addressing and control signals to the row driver 54.

Figure 3:
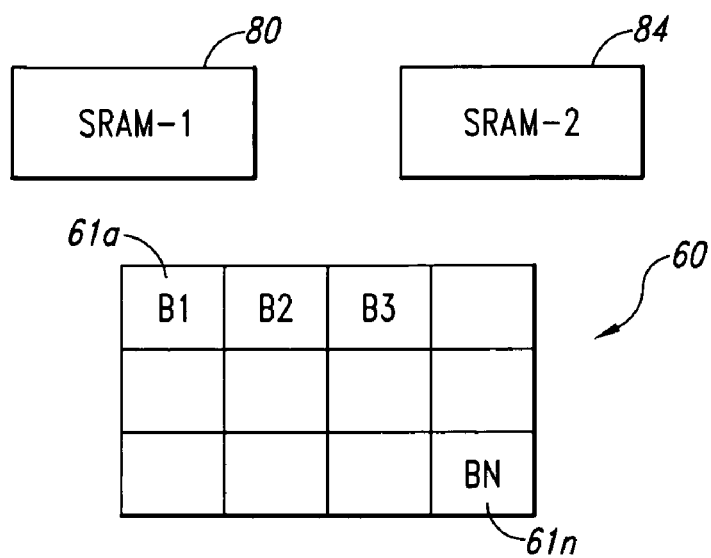
FIG. 3, is a diagram conceptually illustrating a DRAM and SRAM arrays shown in the cache system of FIG. 2.
Figure 4:
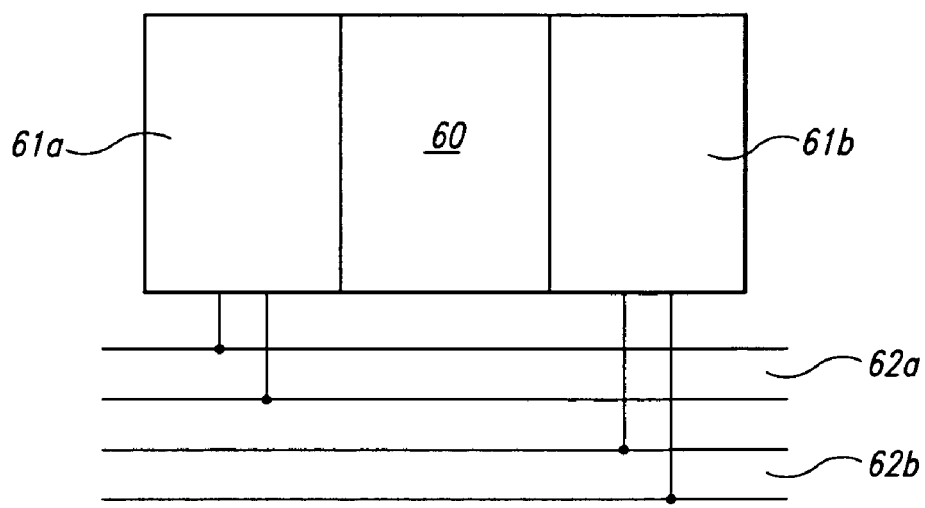
FIG. 4 is a block diagram showing two pair of complimentary input/output lines coupled to respective blocks of a bank of memory according to one embodiment of the invention.

The operation of the command buffer 74, refresh controller 78 and the SRAM arrays 80, 84 in relation to the other components of the cache system 50 will now be explained with reference to the diagram of FIG. 3, which conceptually illustrates the DRAM array 60 and the SRAM arrays 80, 84 shown in FIG. 2. As mentioned above, the DRAM array is divided into a plurality of refresh blocks. The refresh blocks may be part of the same or different banks 60a–n of DRAM memory, or physically different DRAM devices. In the embodiment shown in FIG. 3, each of the refresh blocks 61a–n has a capacity of Y bits, and each of the SRAM arrays 80, 84 also has a capacity of Y bits. Each of the refresh blocks 61a–n may be individually refreshed under control of the refresh controller 78 (FIG. 2). As shown in FIG. 4, the DRAM array 60 has twice the normal number of complimentary input/output ("I/O") line pairs 62, which are configured so that two blocks can be simultaneously accessed. More specifically, a first pair 62a of complimentary I/O lines may be coupled to one block 61a of the DRAM array 60 while a second pair 62b of I/O lines may be coupled to another block 61b of the DRAM array 60. As a result, it is possible for data to be read from or written to one refresh block 61a–n of the DRAM array 60 at the same time data are being transferred from one of the SRAM arrays 80, 84 to another block 61a–n of the DRAM array 60.

In operation, a read from a refresh block 61a–n that is not being refreshed is read in a conventional manner. Similarly, a write to a block 61a–n that is not being refreshed is accomplished in a conventional manner. Thus, no problem is presented in either writing to or reading from a refresh block 61a–n that is not being refreshed. In either of these cases, data access to the cache system 50 does not require any wait, thus allowing the cache system 50 to be used as a cache memory in place of a typically used SRAM without any performance limitations.

The potential problem in accessing the cache system 50 is in the event of a read or a write to a refresh block 61a–n being refreshed, and, in particular, to a different row than the row in that block that is being refreshed. The cache system 50, preferably the refresh controller 78, may check each memory command prior to initiating a refresh in a block 61a–n to determine if the memory command is a read. If a read command directed to a block 61a–n that is about to be refreshed is received, then the refresh is not initiated. In this regard, it is assumed that the duration of a refresh is shorter than the duration of a memory read operation. Each time a read is executed, the read data are written to one of the SRAMs 82, 84. As a result, the read data are subsequently accessible in one of the SRAMs 82, 84, thereby allowing the portion of the block 61a–n that stored such data to be refreshed despite subsequent reads from that that portion. In the case of sequential reads from the rows of a block 61a–n, the reads will refresh the rows.

In the event a memory access is a write to a block 61a–n being refreshed, the write data is instead written to one of the SRAM arrays 80, 84. When the refresh of the block to which the write was directed has been completed, the refresh controller 78 starts a refresh of another block 61a–n of the DRAM array 60. While this subsequent refresh is occurring, the data that had been written to one of the SRAM arrays 80, 84 is transferred to the block 61a–n to which the earlier write was directed. If, during refresh of the second block 61a–n, a read or a write is directed toward that block 61a–n, then that data is instead stored in the other one of the SRAM arrays 80, 84. By the time the refresh of the second block 61a–n has been completed, transfer of the data from first one of the SRAM arrays 80, 84 to the first block 61a–n will have been completed, and that SRAM array 80, 84 will be available to store write data that is subsequently directed to any other block 61a–n that is being refreshed. Therefore, an SRAM array 80, 84 is always available to store write data that is directed to a refresh block 61a–n of the memory array 60 that is being refreshed. As a result, data may always be read from or written to the cache system 50 without the need for to wait for the completion of a refresh of any block 61a–n the cache system 50. The cache system 50 may therefore be used as a cache memory in place of an SRAM that is typically used, thereby providing high capacity caching at relatively little cost.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An integrated circuit memory device, comprising:
   at least one primary memory of the type that must be refreshed;
   a second memory of the type not required to be refreshed;
   an address decoder coupled to receive a memory address and being operable to decode the address and generate decoded address signals corresponding thereto;
   an input/output circuit coupled to the at least one primary memory, the second memory, and the address decoder, the input/output circuit being operable to respond to a first control signal by coupling write data from an external data terminal to a location in the at least one primary memory corresponding to the decoded address signals, or to respond to a second control signal by coupling write data from the external data terminal to a location in the second memory, or to respond to a third control signal by coupling data from the second memory to a location in the at least one primary memory corresponding to the decoded address signals; and
   a control circuit coupled to the at least one primary memory, the second memory, the address decoder, and the input/output circuit, the control circuit being operable to generate the first control signal when the location in the at least one primary memory corresponding to the decoded address signals is not being refreshed, to generate the second control signal when the location in the at least one primary memory corresponding to the decoded address signals is being refreshed, and to generate the third control signal when the location in the at least one primary memory corresponding to the decoded address signals that was being refreshed when the data was stored in one of the second memory is no longer being refreshed.

2. The integrated circuit memory device of claim 1 wherein the control circuit comprises:
   a refresh controller coupled to the at least one primary memory, the refresh controller being operable to refresh the at least one primary memory one location at a time; and
   a control buffer structured to receive a memory command and to generate the first, second and third control signals corresponding thereto.

3. The integrated circuit memory device of claim 1 wherein the second memory comprises a static random access memory ("SRAM") device.

4. The integrated circuit memory device of claim 1 wherein the at least one primary memory comprises at least one dynamic random access memory device.

5. The integrated circuit memory device of claim 1 wherein the input/output circuit comprises a plurality of complimentary input/output line pairs, the input/output lines being sufficient in number that a first pair of input/output lines may be coupled to one location in the at least one primary memory while a second pair of input/output lines may be coupled to another location in the at least one primary memory.

6. The integrated circuit memory device of claim 1, further comprising a third memory operable to store data in the event the first memory is busy storing data or reading or writing data.

7. An integrated circuit memory device, comprising:
   at least one primary memory of the type that must be refreshed;
   a second memory coupled to the at least one primary memory for direct transfer of data from the second memory to any location in the at least one primary memory if the location in the at least one primary memory is not being refreshed; and
   an input/output circuit coupled to the at least one primary memory and the second memory, the input/output circuit being operable to store write data in a location in the at least one primary memory to which the write data was directed, and to store write data directed to any location in the at least one primary memory in the second memory if the location in the primary memory to which the write data was directed is being refreshed.

8. The integrated circuit memory device of claim 7 wherein the primary memory comprises at least one dynamic random access memory device.

9. The integrated circuit memory device of claim 7 wherein the input/output circuit comprises a plurality of complimentary input/output line pairs, the input/output lines being sufficient in number that a first pair of input/output lines may be coupled to location of the at least one primary memory while a second pair of input/output lines may be coupled to another location in the at least one primary memory.

10. The integrated circuit memory device claim 7 wherein the second memory comprises a static random access memory device.

11. A processor-based system, comprising:
    a processor having a processor bus;
    an input device coupled to the processor through the processor bus and adapted to allow data to be entered into the computer system;
    an output device coupled to the processor through the processor bus adapted to allow data to be output from the computer system; and
    a system controller coupled to the processor bus;
    an integrated circuit memory device coupled to the processor through the system controller, comprising:
    at least one primary memory of the type that must be refreshed;
    a second memory of the type not required to be refreshed;
    an address decoder coupled to receive a memory address and being operable to decode the address and generate decoded address signals corresponding thereto;
    an input/output circuit coupled to the at least one primary memory, the second memory, and the address decoder, the input/output circuit being operable to respond to a first control signal by coupling write data from an external data terminal to a location in the at least one primary memory corresponding to the decoded address signals, or to respond to a second control signal by coupling write data from the external data terminal to a location in the second memory, or to respond to a third control signal by coupling data from the second memory to a location in the at least one primary memory corresponding to the decoded address signals; and a control circuit coupled to the at least one primary memory, the second memory, the address decoder, and the input/output circuit, the control circuit being operable to generate the first control signal when the location in the at least one primary memory corresponding to the decoded address signals is not being refreshed, to generate the second control signal when the location in the at least one primary memory corresponding to the decoded address signals is being refreshed, and to generate the third control signal when the location in the at least one primary memory corresponding to the decoded address signals that was being refreshed when the data was stored in one of the second memory is no longer being refreshed.

12. The processor-based system of claim 11 wherein the second memory comprises a static random access memory ("SRAM") device.

13. The processor-based system of claim 11 wherein the control circuit comprises:
a refresh controller coupled to the at least one primary memory, the refresh controller being operable to refresh the at least one primary memory one location at a time; and
a control buffer structured to receive a memory command and to generate the first, second and third control signals corresponding thereto.

14. The processor-based system of claim 11 the at least one primary memory comprises at least one dynamic random access memory device.

15. The processor-based system of claim 11 wherein the input/output circuit comprises a plurality of complimentary input/output line pairs, the input/output lines being sufficient in number that a first pair of input/output lines may be coupled to one location in the at least one primary memory while a second pair of input/output lines may be coupled to another location in the at least one primary memory.

16. The processor-based system of claim 11, further comprising a third memory operable to store data in the event the second memory is busy storing data or reading or writing data.

17. A processor-based system, comprising:
a processor having a processor bus;
an input device coupled to the processor through the processor bus and adapted to allow data to be entered into the computer system;
an output device coupled to the processor through the processor bus adapted to allow data to be output from the computer system; and
a system controller coupled to the processor bus;
an integrated circuit memory device coupled to the processor through the system controller, comprising:
at least one primary memory of the type that must be refreshed;
a second memory coupled to the at least one primary memory for direct transfer of data from the second memory to any location in the at least one primary memory if the location in the at least one primary memory is not being refreshed; and
an input/output circuit coupled to the at least one primary memory and the second memory, the input/output circuit being operable to store write data in a location in the at least one primary memory to which the write data was directed, and to store write data directed to any location in the at least one primary memory in the second memory if the location in the primary memory to which the write data was directed is being refreshed.

18. The processor-based system of claim 17 wherein the primary memory comprises at least one dynamic random access memory device.

19. The processor-based system of claim 17 wherein the input/output circuit comprises a plurality of complimentary input/output line pairs, the input/output lines being sufficient in number that a first pair of input/output lines may be coupled to location of the at least one primary memory while a second pair of input/output lines may be coupled to another location in the at least one primary memory.

20. The processor-based system of claim 17 wherein the second memory comprises a static random access memory device.

21. An integrated circuit memory device, comprising:
at least one primary memory having a plurality of memory locations, each of the memory locations being temporarily inaccessible at times for a memory write operation;
a second memory having a plurality of memory locations that are accessible at all times for a memory write operation;
an address decoder coupled to receive a memory address and being operable to decode the address and generate decoded address signals corresponding thereto;
an input/output circuit coupled to the at least one primary memory, the second memory, and the address decoder, the input/output circuit being operable to respond to a first control signal by coupling write data from an external data terminal to a location in the at least one primary memory corresponding to the decoded address signals, or to respond to a second control signal by coupling write data from the external data terminal to a location in the second memory, or to respond to a third control signal by coupling data from the second memory to a location in the at least one primary memory corresponding to the decoded address signals; and
a control circuit coupled to the at least one primary memory, the second memory, the address decoder, and the input/output circuit, the control circuit being operable to generate the first control signal when the location in the at least one primary memory corresponding to the decoded address signals is accessible for a memory write operation, to generate the second control signal when the location in the at least one primary memory corresponding to the decoded address signals is inaccessible for a memory write operation, and to generate the third control signal when the location in the at least one primary memory corresponding to the decoded address signals that was inaccessible when the data was stored in one of the second memory is now accessible.

22. The integrated circuit memory device of claim 21 wherein the second memory comprises a static random access memory ("SRAM") device.

23. The integrated circuit memory device of claim 21 wherein the at least one primary memory comprises at least one dynamic random access memory device.

24. The integrated circuit memory device of claim 21 wherein the input/output circuit comprises a plurality of complimentary input/output line pairs, the input/output lines being sufficient in number that a first pair of input/output lines may be coupled to one location in the at least one primary memory while a second pair of input/output lines may be coupled to another location in the at least one primary memory.

25. The integrated circuit memory device of claim 21, further comprising a third memory operable to store data in the event the second memory is busy storing data or reading or writing data.

26. An integrated circuit memory device, comprising:
at least one primary memory having a plurality of memory locations, each of the memory locations being temporarily inaccessible at times for a memory write operation;
a second memory coupled to the at least one primary memory for direct transfer of data from the second memory to any location in the at least one primary memory if the location in the at least one primary memory is accessible; and
an input/output circuit coupled to the at least one primary memory and the second memory, the input/output circuit being operable to store write data in a location in the at least one primary memory to which the write data was directed, and to store write data directed to any location in the at least one primary memory in the second memory if the location in the primary memory to which the write data was directed is inaccessible.

27. The integrated circuit memory device of claim 26 wherein the primary memory comprises at least one dynamic random access memory device.

28. The integrated circuit memory device of claim 26 wherein the input/output circuit comprises a plurality of complimentary input/output line pairs, the input/output lines being sufficient in number that a first pair of input/output lines may be coupled to location of the at least one primary memory while a second pair of input/output lines may be coupled to another location in the at least one primary memory.

29. The integrated circuit memory device claim 26 wherein the second memory comprises a static random access memory device.

30. A method of storing data in an integrated circuit memory device having a plurality of locations each of which may be refreshed, the method comprising:
providing a second memory in the integrated circuit memory device;
addressing a first location in the integrated circuit memory device in an attempt to write data into the first location in the integrated circuit memory device;
if the first location in the integrated circuit memory device is being refreshed during the attempt, writing the data into the second memory;
after the first location in the integrated circuit memory device is no longer being refreshed, transferring the data stored in the second memory to the first location in the integrated circuit memory device.

31. The method of claim 30 wherein the integrated circuit memory device further includes a third memory, and wherein in the method further comprises:
writing the data into the alternate auxiliary memory if the second memory is storing data or data are being written to or read from the second memory when the first location in the integrated circuit memory device is being refreshed during the attempt to write the data into the first location in the integrated circuit memory device; and
after the first location in the integrated circuit memory device is no longer being refreshed, transferring the data stored in the third memory to the first location in the integrated circuit memory device.

32. The method of claim 30 wherein the second memory comprises static random access memory.

33. The method of claim 30 further comprising writing the data into a first SRAM if a second location in the integrated circuit memory device is being refreshed during the attempt to write the data into the second location in the integrated circuit memory device and the data is not being transferred from the second memory to the first location in the integrated circuit memory device.

34. The method of claim 30 further comprising writing the data into the first location in the integrated circuit memory device if the first location in the integrated circuit memory device is not being refreshed during the attempt.

35. The method of claim 30 further comprising:
addressing the first location in the integrated circuit memory device in an attempt to read the data from the first location in the integrated circuit memory device; and
outputting the data from the first location in the integrated circuit memory device.

36. The method of claim 35 wherein the act of outputting the data from the first location in the integrated circuit memory device is accomplished regardless of whether or not the first location in the integrated circuit memory device is being refreshed.

37. The method of claim 30 further comprising:
addressing the first location in the integrated circuit memory device in an attempt to read the data from the first location in the integrated circuit memory device; and
outputting the data from the first location in the integrated circuit memory device; and
caching the data output from the first location in the integrated circuit memory device in the second memory.

38. The method of claim 37 further comprising
addressing the first location in the integrated circuit memory device in an attempt to read the data from the first location in the integrated circuit memory device; and
outputting the data from the second memory.

39. A method of storing data in an integrated circuit memory device, the method comprising:
providing a primary memory in the integrated circuit memory device, the primary memory having a plurality of locations each of which may be refreshed, the primary memory including memory cells arranged in rows and columns;
providing a second memory and a third memory in the integrated circuit memory device, each of the second and third memories having sufficient capacity to store a row of data from the primary memory;
sequentially attempting to write data to locations of the primary memory;
if a location in the primary memory to which the data is attempted to be written is being refreshed, writing the data to the second memory;
when the refresh of a location in the primary memory has been completed, attempting to transfer the data from the second memory to which the data had been written to a location in the primary memory to which the data was attempted to be written; and
if the location in the primary memory to which the data was attempted to be written is being refreshed when the attempt is made to transfer the data from the second memory to the location in the primary memory to which the data was attempted to be written, writing the data to the third memory.

40. The method of claim 39 wherein each of the second and third memories comprises a static random access memory.

41. The method of claim 39 further comprising, if the location in the primary memory to which the data is attempted to be written is not being refreshed, writing the data to the location in the primary memory.

42. The method of claim 39 further comprising:
attempting to read the data from the location in the primary memory to which the data was attempted to be written; and
outputting the data from the location in the primary memory to which the attempt to read data is directed.

43. The method of claim 42 wherein the act of outputting the data from the location in the primary memory is accomplished regardless of whether or not the location in the primary memory is being refreshed.

44. The method of claim 42 further comprising:
attempting to read the data from the location in the primary memory to which the data was attempted to be written;
outputting the data from the location in the primary memory to which the attempt to read data is directed and
caching the data output from the primary memory in one of the second and third memories.

45. A method of storing data in an integrated circuit memory device, the method comprising:
providing a primary memory in the integrated circuit memory device, the primary memory having a plurality of memory locations each of which is temporarily inaccessible at times for a memory wnte operation, the primary memory including memory cells arranged in rows and columns;
providing a second memory in the integrated circuit memory device, the second memory having sufficient capacity to store a row of data from the primary memory;
sequentially attempting to write data to locations of the primary memory;
if a location in the primary memory to which the data is attempted to be written is inaccessible, writing the data to the second memory; and
when the location in the primary memory is accessible, attempting to transfer the data from the second memory to which the data had been written to a location in the primary memory to which the data was attempted to be written.

46. The method of claim 45, further comprising,
providing a third memory having sufficient capacity to store a row of data from the primary memory; and
if the location in the primary memory to which the data was attempted to be written is being refreshed when the attempt is made to transfer the data from the second memory to the location in the primary memory to which the data was attempted to be written, writing the data to the third memory.

47. The method of claim 45 wherein the second memory comprises a static random access memory.

48. The method of claim 45, further comprising:
attempting to read the data from the location in the primary memory to which the data was attempted to be written; and
outputting the data from the primary memory to which the attempt to read data is directed.

49. The method of claim 48 wherein the act of outputting the data from the location in the primary memory is accomplished regardless of whether or not the location in the primary memory is accessible for a memory write operation.

50. The method of claim 45 further comprising:
attempting to read the data from the location in the primary memory to which the data was attempted to be written;
outputting the data from the primary memory to which the attempt to read data is directed and
caching the data output from the primary memory in the second memory.

* * * * *